United States Patent
Eum et al.

(10) Patent No.: US 9,467,137 B2
(45) Date of Patent: Oct. 11, 2016

(54) INPUT CURRENT CONTROL METHOD, SWITCH CONTROL CIRCUIT AND POWER SUPPLY INCLUDING THE SWITCH CONTROL CIRCUIT

(71) Applicant: FAIRCHILD KOREA SEMICONDUCTOR LTD., Bucheon-si (KR)

(72) Inventors: Hyun-Chul Eum, Seoul (KR); Young-Jong Kim, Seoul (KR)

(73) Assignee: Fairchild Korea Semiconductor LTD. (KR)

( * ) Notice: Subject to any disclaimer, the term of this patent is extended or adjusted under 35 U.S.C. 154(b) by 36 days.

(21) Appl. No.: 14/546,624

(22) Filed: Nov. 18, 2014

(65) Prior Publication Data

US 2015/0137859 A1    May 21, 2015

(30) Foreign Application Priority Data

Nov. 18, 2013 (KR) ........................ 10-2013-0140149

(51) Int. Cl.
*H03B 1/00* (2006.01)
*H03K 17/16* (2006.01)
*H02M 3/335* (2006.01)

(52) U.S. Cl.
CPC ......... *H03K 17/16* (2013.01); *H02M 3/33523* (2013.01); *H03K 2217/0027* (2013.01)

(58) Field of Classification Search
CPC ..................................................... H03K 17/16
See application file for complete search history.

(56) References Cited

U.S. PATENT DOCUMENTS

2014/0293660 A1* 10/2014 Teo .................. H02M 3/33507
363/21.17

OTHER PUBLICATIONS

Texas Instruments, LM3445—Triac Dimmable Offline LED Driver, SNVS570L—Jan. 2009, Revised May 2013, 39 pages.

* cited by examiner

*Primary Examiner* — Daniel Puentes
(74) *Attorney, Agent, or Firm* — Grossman Tucker Perreault & Pfleger PLLC

(57) ABSTRACT

A switch control circuit that controls a switching operation of a power switch includes: an input current calculator generating an input sense voltage by integrating a sense voltage that indicates a switching current flowing to the power switch for a switching period unit of the power switch; and an input current comparator generating a gate-off signal according to a result of comparison between the input sense voltage and a predetermined input reference voltage, wherein the power switch is turned off according to the gate-off signal.

29 Claims, 8 Drawing Sheets

INPUT CURRENT CONTROL METHOD, SWITCH CONTROL CIRCUIT AND POWER SUPPLY INCLUDING THE SWITCH CONTROL CIRCUIT

CROSS-REFERENCE TO RELATED APPLICATION

This application claims priority to and the benefit of Korean Patent Application No. 10-2013-0140149 filed in the Korean Intellectual Property Office on Nov. 18, 2013, the entire contents of which are incorporated herein by reference.

BACKGROUND (a) Technical Field

Exemplary embodiments described with reference to the accompanying drawings relate to an input current control method, a switch control circuit using the input current control method, and a power supply including the switch control circuit.

(b) Description of the Related Art

In a power supply, a peak of a current (i.e., a switch current) that flows to a power switch that controls powering is controlled to not exceed a predetermined current limit so as to control an input current of the power supply. In this case, the current limit is changed in order to constantly control the input current.

For example, the current limit may be a waveform of a sine wave function for constant control of the input current. However, although the current limit is changed, the input current cannot be precisely and constantly controlled, and distortion of the input current may occur at a zero crossing point of an input voltage. In addition, external elements (e.g., capacitors, resistors, and the like) of a switch control IC should be appropriately set so as to set the current limit.

The above information disclosed in this Background section is only for enhancement of understanding of the background of the invention and therefore it may contain information that does not form the prior art that is already known in this country to a person of ordinary skill in the art.

SUMMARY

The invention has been made in an effort to provide an input current control method that can constantly and precisely control an input current, a switch control circuit using the input current control method, and a power supply using the switch control circuit.

An input current control method of a power supply according to an exemplary embodiment of the invention includes: generating an input sense voltage by integrating a sense voltage that indicates a switch current flowing to the power switch for a switching period of the power switch; generating an input sense voltage by integrating a sense voltage that indicates a switch current flowing to the power switch for a switching period of the power switch; and controlling a switching operation of the power switch according to a result of the comparison.

The generating the input sense voltage includes converting the sense voltage to a sense current and charging a first capacitor using the sense current, and the input sense voltage is a voltage charged in the first capacitor The charging the first capacitor with the sense current is performed until the input sense voltage reaches the input reference voltage.

The controlling the switching operation includes turning off the power switch at a time that the input sense voltage reaches the input reference voltage.

The input current control method further includes generating a predetermined reference voltage and the input reference voltage that is determined according to the switching period.

The generating the input reference voltage further includes: converting the reference voltage to a reference current; charging a second capacitor for the switching period using the reference current; and generating the input reference voltage by sampling and holding a peak of a switching period voltage charged in the second capacitor for each switching period.

The voltage charged in the second capacitor is reset by being synchronized at a turn-on time of the power switch.

The charging the second capacitor further includes being performed for a predetermined switching enable period.

The input current control method further includes: generating a first output according to a level of a switching enable signal that instructs the switching enable period by being synchronized with an oscillator signal that determines a switching frequency of the power switch; generating a second output according to a level of the first output by being synchronized with the oscillator signal; and performing an OR operation on the first output and the second output, and generating a gate voltage for driving of the power switch according to a result of the operation.

The input current control method may further include generating the reference voltage using a comparison voltage generated by amplifying a difference between a voltage that corresponds to an output current of the power supply and a first reference voltage and information corresponding to an input voltage of the power supply.

The generating the input reference voltage may include generating the input reference voltage by multiplying the reference voltage and the switching period.

The generating the reference voltage may include generating the reference voltage by multiplying the comparison voltage and the input voltage.

A switch control circuit that controls a switching operation of a power switch according to an exemplary embodiment of the present invention includes: an input current calculator generating an input sense voltage by integrating a sense voltage that indicates a switching current flowing to the power switch for a switching period unit of the power switch; and an input current comparator generating a gate-off signal according to a result of comparison between the input sense voltage and a predetermined input reference voltage, wherein the power switch is turned off according to the gate-off signal.

The input current calculator includes a converter receiving a first voltage-current receiving the sense voltage and generating a sense current that depends on the sense voltage, and a first charging unit generating the input sense voltage by charging a first capacitor for a turn-on period of the power switch with a current that corresponds to the sense current.

The first voltage-current converter includes: a first error amplifier generating an output that controls a voltage of a first input end to which the sense voltage is input and a voltage of a second input terminal to be equivalent to each other; a first BJT including a base to which an output of the first error amplifier is input; and a first resistor including a first terminal connected to an emitter of the first BJT and the second input terminal. The sense current flows to a ground through the first BJT and the first resistor.

The input current calculator further includes a first current mirror circuit connected to a collector of the first BJT and supplying a current to the first capacitor by mirroring the sense current.

The first charging unit includes a first transistor connected in parallel with the first capacitor, and the first transistor is turned off during a turn-on period of the power switch.

The switch control circuit further includes a multiplier that generates a predetermined reference voltage and an input reference voltage using the switching period.

The multiplier includes: a second voltage-current converter receiving the reference voltage and generating a reference current that depends on the reference voltage; a second charging unit generating a switching period voltage by charging a second capacitor with a current that corresponds to the reference current for the switching period; and a sampling/holding unit generating the input reference voltage by sampling and holding a peak of the switching period voltage for each switching period.

The second voltage-current converter includes: a second error amplifier generating an output that controls a voltage of a first input end to which the reference voltage is input and a voltage of a second input terminal to be equivalent to each other; a second BJT including a base to which an output of the second error amplifier is input; and a second resistor including a first terminal connected to an emitter of the second BJT and the second input terminal, and the reference current flows to the ground through the second BJT and the second resistor.

The multiplier further includes a second current mirror circuit connected to a collector of the second BJT and supplying a current to the second capacitor by mirroring the reference current.

The second charging unit includes a second transistor connected in parallel with the second capacitor, and the second transistor is turned on by being synchronized at a turn-on time of the power switch.

The multiplier further includes an enable switch that controls a current supplied to the second capacitor, and the enable switch performs a switching operation according to a switching enable signal and the switching enable signal controls a switching operation period of the power switch.

The switch control circuit further includes a gate enable unit determining whether or not to output a gate voltage that switches the power switch based on the switching enable signal and an oscillator signal that determines the switching frequency.

The gate enable unit includes: a first D-flip-flop unit having a clock terminal to which the oscillator signal that determines the switching frequency of the power switch is input and an input terminal to which the switching enable signal is input, and outputting a first output according to the switching enable signal by being synchronized with the oscillator signal; a second D-flip-flop having a clock terminal to which the oscillator signal is input and an input terminal to which the first output is input, and generating a second output according to a level of the first output by being synchronized with the oscillator signal; and an OR gate that performs an OR operation on the first output and the second output.

The input current calculator includes a first resistor to which the sense voltage is applied and a first capacitor being charged with a current that corresponds to a sense current flowing to the first resistor, the multiplier includes a second resistor to which the reference voltage is input and a second capacitor charged with a current that corresponds to a reference current flowing to the second resistor, and the input current is proportional to a result acquired by dividing a value of multiplication of resistance of the first resistor and capacitance of the first capacitor with a value of multiplication of resistance of the second resistor and capacitance of the second capacitor.

The switch control circuit may further include: a first multiplier generating the reference voltage using information on an input voltage of the power supply and a comparison voltage generated by amplifying a difference between a voltage corresponding to an output current controlled according to the switching operation of the power switch and a first reference voltage; and a second multiplier generating the input reference voltage by multiplying a reference voltage and a switching period of the power switch.

A power supply according to an exemplary embodiment of the present invention includes: a power switch electrically connected with an input voltage; and a switch control circuit generating an input sense voltage by integrating a sense voltage that indicates a switching current flowing to the power switch for each switching period of the power switch, and controlling a switching operation of the power switch according to a result of comparison between the input sense voltage and a predetermined input reference voltage.

The switch control circuit generates a switching period voltage by charging a capacitor using a predetermined reference voltage for each switching period, and generates the input reference voltage by sampling and holding the switching period voltage for each switching period.

The switch control circuit determines whether or not to output a gate voltage that switches the power switch based on a switching enable signal that instructs a predetermined switching enable period and an oscillator signal that determines a switching frequency of the power switch.

The switching enable period is a predetermined period in a period during which the input voltage is generated.

The switch control circuit may further include: a first multiplier generating the reference voltage using information on the input voltage of the power supply and a comparison voltage generated by amplifying a difference between a voltage corresponding to an output current of the power supply and a first reference voltage; and a second multiplier generating the input reference voltage by multiplying a reference voltage and a switching period of the power switch.

According to the exemplary embodiments, an input current control method for constant and precise control of an input current, a switch control circuit using the input current control method, and a power supply including the switch control circuit are provided.

DETAILED DESCRIPTION OF THE EMBODIMENTS

Figure 1:
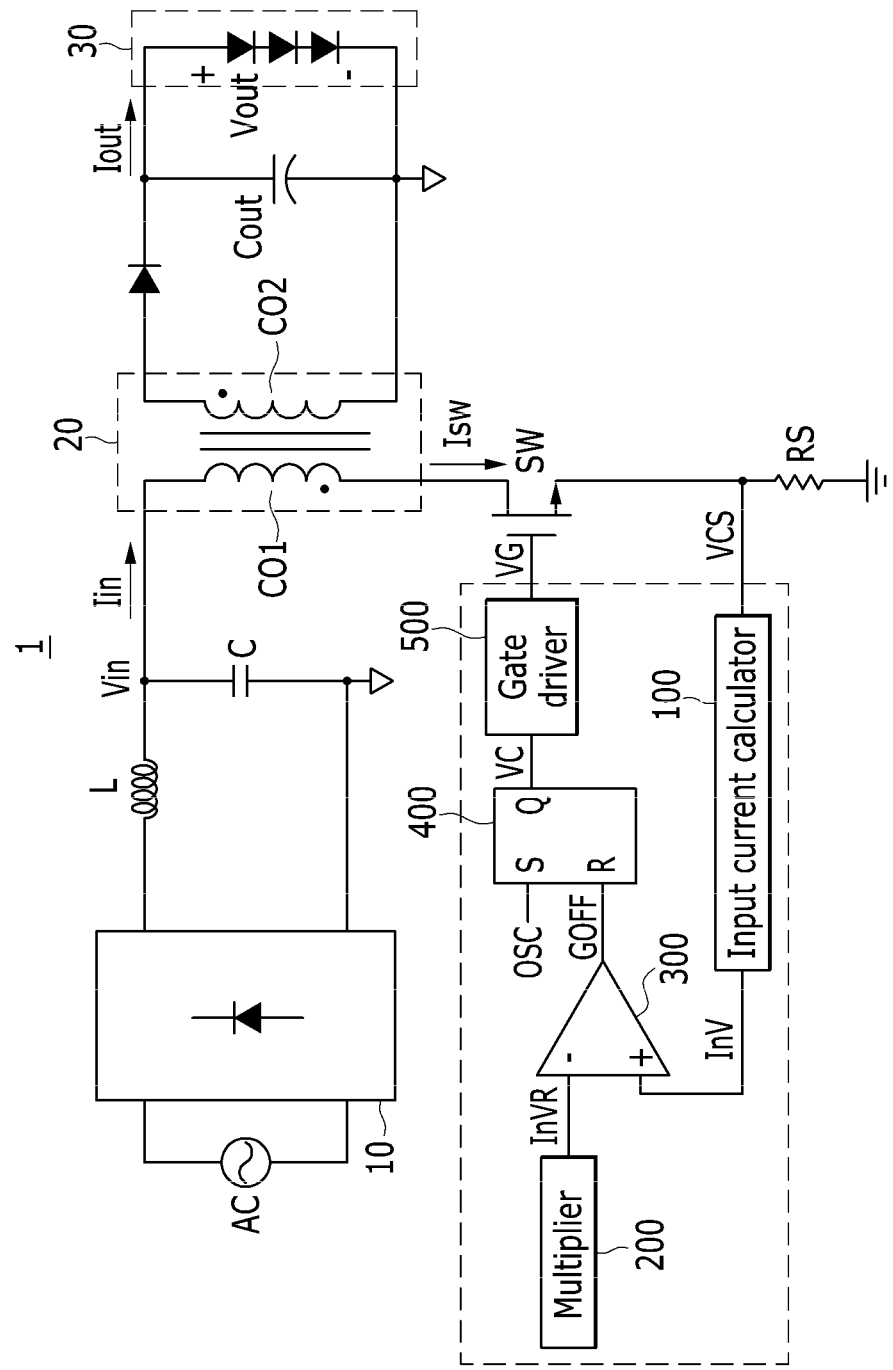
FIG. 1 shows a power supply according to an exemplary embodiment.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

FIG. 1 shows a power supply according to an exemplary embodiment of the present invention.

The power supply of FIG. 1 employs a method for controlling an input current with a predetermined input reference current by calculating the input current in real time.

The input current calculation method according to the exemplary embodiment may calculate the input current in real time by using a current (hereinafter referred to as a switch current) flowing to the power supply. The input current calculated in real time is compared with an input reference current, and the input current may match an input reference current by controlling a switching operation of a switch (hereinafter, a power switch) of the power supply.

In detail, in the exemplary embodiment, an input sense voltage InV that corresponds to an input current Iin is generated using a sense voltage VCS that indicates a switch current Isw, the input sense voltage InV and an input reference voltage InVR that corresponds to the input reference current are compared with each other, and the switching operation of the power switch is controlled according to a result of the comparison. The input reference voltage InVR may be fixed to a predetermined voltage or may be changed according to a switching cycle. For example, when the switching cycle is fixed, the input reference voltage InVR is fixed to a constant level. Hereinafter, the exemplary embodiment will be described with reference to FIG. 1.

As shown in FIG. 1, a power supply 1 includes a rectification circuit 10, an inductor L, a capacitor C, a transformer 20, a rectification diode D, an output capacitor COUT, a power switch SW, a sense resistor RS, and a switch control circuit 40.

Lateral output ends of a power supply 1 are connected to a load 30, and a plurality of LEDs are connected in series as an example of the load 30 in FIG. 1. However, the exemplary embodiment is not limited thereto.

The AC input AC is rectified through the rectification circuit 10, and the rectified AC input becomes a DC through an LC filter formed of the inductor L and the capacitor C. The rectification circuit 10 may be a full-bridge diode, which is a full-wave rectification circuit.

The transformer 20 includes a primary wire CO1 connected to the input voltage Vin and a secondary wire CO2 connected to an output voltage Vout. The primary wire CO1 and the secondary wire CO2 are coupled in an insulated manner with a predetermined turn ratio (turns of primary wire CO1 to turns of secondary wire CO2).

A first end of the primary wire CO1 is connected to an input voltage Vin and a second end of the primary wire CO1 is connected to a first electrode (i.e., a drain) of the power switch SW. A current flowing during a turn-on period of the power switch SW flows to the primary coil CO1 and thus energy is stored.

A first end of the secondary wire CO2 is connected to an anode of the rectification diode D1 and a second end of the secondary wire CO2 is connected to a secondary ground. During a turn-off period of the power switch SW, energy stored in the primary wire CO1 is transmitted to the secondary wire CO2.

The power switch SW is electrically connected to the input voltage Vin and controls output power of the power supply. A gate of the power switch SW is connected with a gate voltage VG supplied from the switch control circuit 40, and the other electrode (i.e., a source) of the power switch SW is connected to a primary ground through the sense resistor RS. The power switch SW is turned on by a high-level gate voltage VG and turned off by a low-level gate voltage VG.

The output capacitor COUT is connected between lateral output ends of the power supply 1. A first electrode of the output capacitor COUT is connected to a cathode of the rectification diode D and a second electrode of the output capacitor COUT is connected to the secondary ground.

A current flowing to the secondary wire CO2 passes through the rectification diode D. The current passed through the rectification diode D is supplied to the load 30 and the output voltage Vout is smoothened by the output capacitor COUT.

The switch control circuit 40 includes an input current calculator 100, a multiplier 200, an input current comparator 300, an SR latch 400, and a gate driver 500.

The switch control circuit 40 generates a gate voltage VG according to a result of comparison between an input sense voltage InV that corresponds to an input current Iin and the input reference voltage InVR using the sense voltage VCS.

The input current Iin calculation method applied to the switch control circuit 40 is as follows.

The input current Iin is an average switch current Isw during one switching cycle of the power switch SW. Thus, the input current Iin is proportional to the total amount of the switch current Isw during one switching cycle. That is, the input sense voltage InV is proportional to an integration result of the sense voltage VCS during one switching cycle.

In order to calculate an average of the switch current Isw during one switching cycle, the total amount of switch current Isw during one switching cycle needs to be divided by switching cycles Ts. That is, a result (hereinafter, a sense voltage average) acquired by dividing the integration result of the sense voltage VCS during one switching cycle by the switching cycles Ts indicates the input current Iin.

The switch control circuit 40 controls a switching operation to make the sense voltage average correspond to a predetermined value that corresponds to the input reference current. For example, the switch control circuit 40 turns off the power switch SW when the input sense voltage InV reaches the input reference voltage InVR.

The input current calculator 100 according to the exemplary embodiment generates the input sense voltage InV. That is, the input current calculator 100 generates the input sense voltage InV by integrating the sense voltage VCS.

The multiplier 200 generates the input reference voltage InVR by multiplying a predetermined reference voltage and a switching cycle.

The input current comparator 300 compares the input sense voltage InV with the input reference voltage InVR, and generates a gate-off signal GOFF according to a comparison result. For example, the input current comparator 300 includes a non-inversion terminal (+) to which the input sense voltage InV is input and an inversion terminal (−) to which the input reference voltage InVR is input, and generates a high-level gate off signal GOFF when an input of the non-inversion terminal (+) is higher than an input of the inversion terminal (−) and generates a low-level gate-off signal GOFF in the opposite case.

The SR latch 400 generates a gate control signal VC that turns on the power switch SW according to an oscillator signal OSC that determines a switching cycle, and generates a gate control signal VC that turns off the power switch according to the gate-off signal GOFF.

The SR latch 400 includes a set terminal S to which the oscillator signal OSC is input, a reset terminal R to which the gate-off signal GOFF is input, and an output terminal Q to which the gate control signal VC is input. The SR latch 400 generates a high-level gate-off signal VC by being synchronized at a rising edge of the input of the set terminal S and generates a low-level gate control signal by being synchronized at a rising edge of an input of the reset terminal R.

The gate driver 500 generates a gate voltage VG according to the gate control signal VC. For example, the gate driver 500 generates a high-level gate voltage VG according to the high-level gate control signal VC and generates a low-level gate voltage VG according to the low-level gate control signal VD.

Hereinafter, the input current calculator and the multiplier according to the exemplary embodiment of the present invention will be described with reference to FIG. 2.

Figure 2:
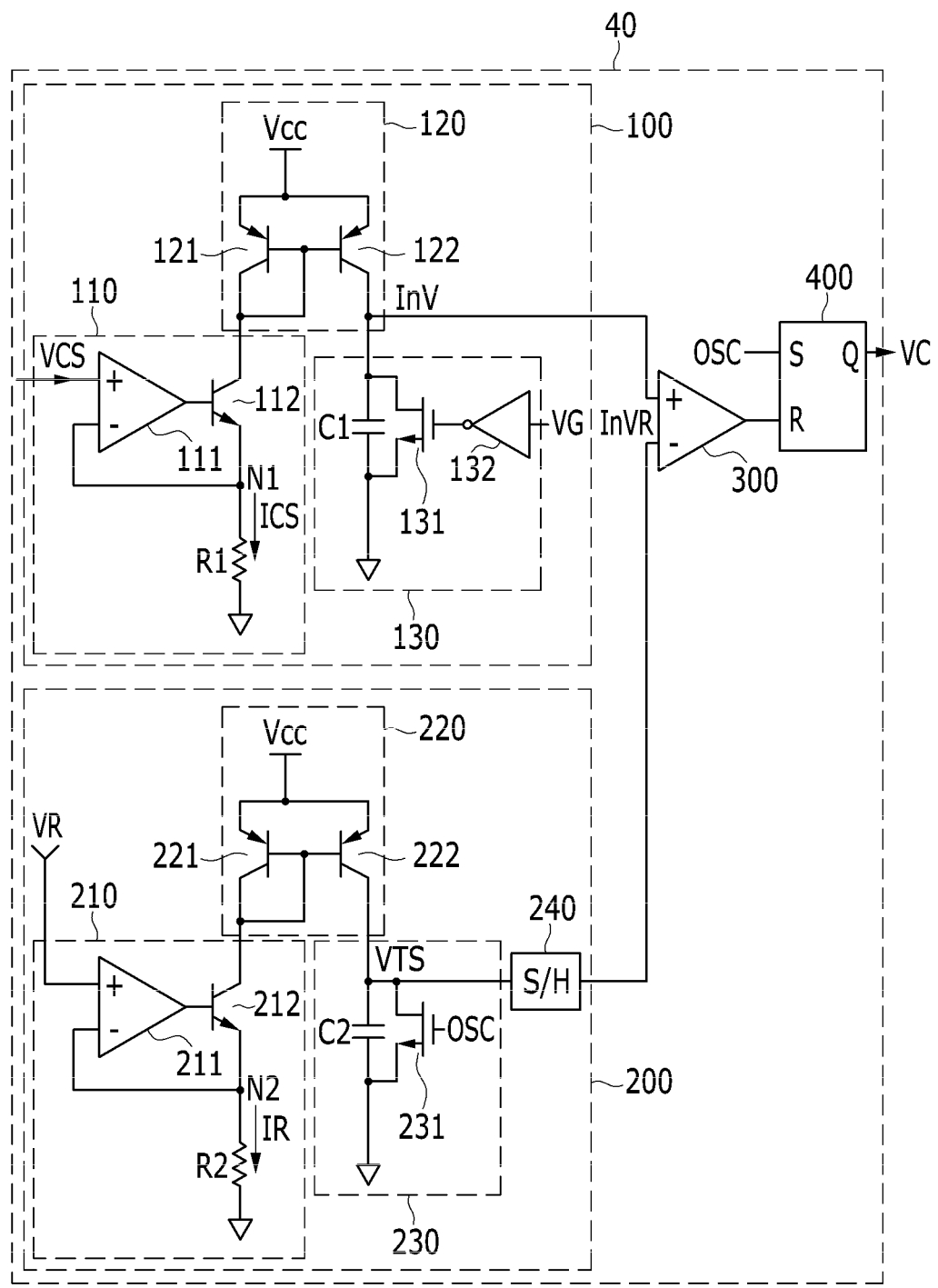
FIG. 2 shows a switch control circuit according to the exemplary embodiment.

FIG. 2 shows the switch control circuit according to the exemplary embodiment of the present invention.

FIG. 2 illustrates a structure of the input current calculator 100 and the multiplier 200. In FIG. 2, the input current calculator 100 is an example of a circuit that integrates the sense voltage VS for every switching cycle unit, and the multiplier 200 is an example of a circuit that generates the input reference voltage InVR by multiplying the reference voltage VREF and the switching cycle Ts.

The input current calculator 100 includes a voltage-current converter 110, a current mirror circuit 120, and a charger 130.

The voltage-current converter 110 receives the sense voltage VCS and generates a sense current ICS according to the sense voltage VCS. The voltage-current converter 110 includes an error amplifier 111, a bipolar-junction transistor (BJT) 112, and a resistor R1.

The error amplifier 111 generates an output that controls two input terminals (+ and −) with the same voltage. The non-inversion terminal (+) of the error amplifier 111 is connected to the sense voltage VCS and the inversion terminal (−) of the error amplifier 111 is connected to a node N1. The node N1 is connected to a first end of the resistor R1 and an emitter of the BJT 112.

An output end of the error amplifier 111 is connected to a base of the BJT 112, and an output of the error amplifier 111 according to a voltage difference of the two input terminals (+ and −) is supplied to a base of the BJT 112. That is, a base current of the BJT 112 varies depending on the output of the error amplifier 111. Since the sense current ICS flowing from the emitter of the BJT 112 varies depending on the base current of the BJT 112, the sense current ICS varies depending on the voltage difference of the two input terminals (+ and −).

For example, when a voltage of the non-inversion terminal (+) is higher than the voltage of the inversion terminal (−), the base current is increased so that the sense current ICS is increased. Then, a voltage of the node N1 is increased. On the contrary, when the voltage of the non-inversion terminal (+) is lower than the voltage of the inversion terminal (−), the base current is decreased so that the sense current ICS is decreased. Then, the voltage of the node N1 is decreased.

Through such operation, the voltage of the node N1 follows the sense voltage VCS, and the sense current ICS is controlled with a value acquired by dividing the sense voltage VCS by resistance of the resistor R1.

The current mirror circuit 120 supplies a mirrored current of the sense current ICS to the charger 130. In the exemplary embodiment, a mirror ratio of the current mirror circuit 120 is 1:1. That is, the current supplied to the charger 130 through the current mirror circuit 120 is the same as the sense current ICS. However, the exemplary embodiment is not limited thereto.

The current mirror circuit 120 includes two BJTs 121 and 122, and emitters of the two BJTs 121 and 122 are connected with a voltage VCC. The current mirror circuits BJTs 121 and 122, and the BJT 112 are biased by the voltage VCC.

A base and a collector of the BJT 121 are connected to each other, a base of the BJT 122 is connected to the base of the BJT 121, and a collector of the BJT 122 is connected to the charger 130. The sense current ICS flowing to the primary ground through the BJT 121 from the voltage VCC is mirrored and thus flows to the charger 130 through the BJT 122.

The charger 130 generates the input sense voltage InV by charging the capacitor C1 during a turn-on period of the power switch SW using the sense current ICS.

The charger 130 includes the capacitor C1, a transistor 131, and an inverter 132.

The capacitor C1 includes a first electrode connected to the collector of the BJT 122 and a second electrode connected to the primary ground. The transistor 131 is connected in parallel to both ends of the capacitor C1. A drain of the transistor 131 is connected to the first electrode of the capacitor C1, a source of the transistor 131 is connected to the second electrode of the capacitor C1 and a primary ground, and a gate of the transistor 131 is connected to an output end of the inverter 132.

The inverter 132 receives the gate voltage VG, and inverts the gate voltage VG and outputs the inverted gate voltage VG. Thus, during the turn-on period of the power switch SW, the transistor 131 is turned off and the capacitor C1 is charged by the sense current ICS. Then, the input sense voltage InV is increased during the turn-on period of the power switch SW. In addition, the transistor 131 is turned on at the time that the gate voltage VG becomes a low level such that the capacitor C1 is discharged. Then, the input sense voltage InV becomes a zero voltage.

In the present exemplary embodiment, the inverter 132 receives the gate voltage VG, but a gate control signal VC that controls the gate voltage VG may be used instead of using the gate voltage VG.

The multiplier 200 includes a voltage-current converter 210, a current mirror circuit 220, a charging unit 230, and a sampling and holding unit 240.

The voltage-current converter 210 receives a reference voltage VR and generates a reference current IR according to the reference voltage VR The voltage-current converter 210 includes an error amplifier 211, a bipolar-junction transistor (BJT) 212, and a resistor R2.

The error amplifier 211 generates an output to control voltages of two input terminals (+ and −) with the same voltage. The non-inversion terminal (+) of the error amplifier 211 is connected to the reference voltage VR and the inversion terminal (−) of the error amplifier 211 is connected to a node N2. The node N2 is connected to a first end of the resistor R2 and an emitter of the BJT 212.

An output end of the error amplifier 211 is connected to a base of the BJT 212, and thus an output of the error amplifier 211 according to a voltage difference between the two input terminals (+ and −) is supplied to the BJT 212. The reference voltage VR is a constant voltage having a predetermined magnitude and thus a voltage of the inversion terminal (−) of the error amplifier 211 is maintained with the reference voltage VR, and a reference current IR is a value acquired by dividing the reference voltage VT by a resistance value of the resistor R1.

The current mirror circuit 220 supplies a mirrored current of the reference current IR to the charging unit 230. In the exemplary embodiment, a mirror ratio of the current mirror circuit 220 is set to 1:1. That is, it is assumed that a current supplied to the charging unit 230 through the current mirror circuit 220 is the same current as the reference current IR. However, the exemplary embodiment is not limited thereto.

The current mirror circuit 220 includes two BJTs 221 and 222, and emitters of the two BJTs 221 and 222 are respectively connected to a voltage VCC. The current mirror circuit BJTs 212, 221, and 222 are biased by the voltage VCC.

A base and a collector of the BJT 221 are connected to each other, a base of the BJT 222 is connected to the base of the BJT 221, and a collector of the BJT 222 is connected to the charging unit 230. The reference current IR flowing from the voltage VCC to the primary ground through the BJT 221 is mirrored, and the mirrored current flows to the charging unit 230 through the BJT 222.

The charging unit 230 generates a switching period voltage VTS by charging a capacitor C2 using the reference current IR during a switching period Ts. The charging unit 230 includes the capacitor C2 and a transistor 231.

The capacitor C2 includes a first electrode connected to the collector of the BJT 222 and a second electrode connected to the primary ground. The transistor 231 is connected in parallel with lateral ends of the capacitor C2. A drain of the transistor 231 is connected to the first electrode of the capacitor C2, a source of the transistor 231 is connected to the second electrode C2 and the primary ground, and an oscillator signal OSC is input to a gate of the transistor 231.

The oscillator signal OSC according to the exemplary embodiment includes a high-level short-pulse that is generated in every switching period. The transistor 231 is turned on by the short-pulse of the oscillator signal OSC that is generated in every switching period, and thus the capacitor C2 is discharged. Then, the switching period voltage VTS becomes a zero voltage.

The sampling and holding unit 240 generates an input reference voltage InVR by sampling and holding a peak of the switching period voltage VTS for each switching period Ts.

Hereinafter, a method for input current control and switching control according to the exemplary embodiment of the present invention will be described with reference to FIG. 3.

Figure 3:
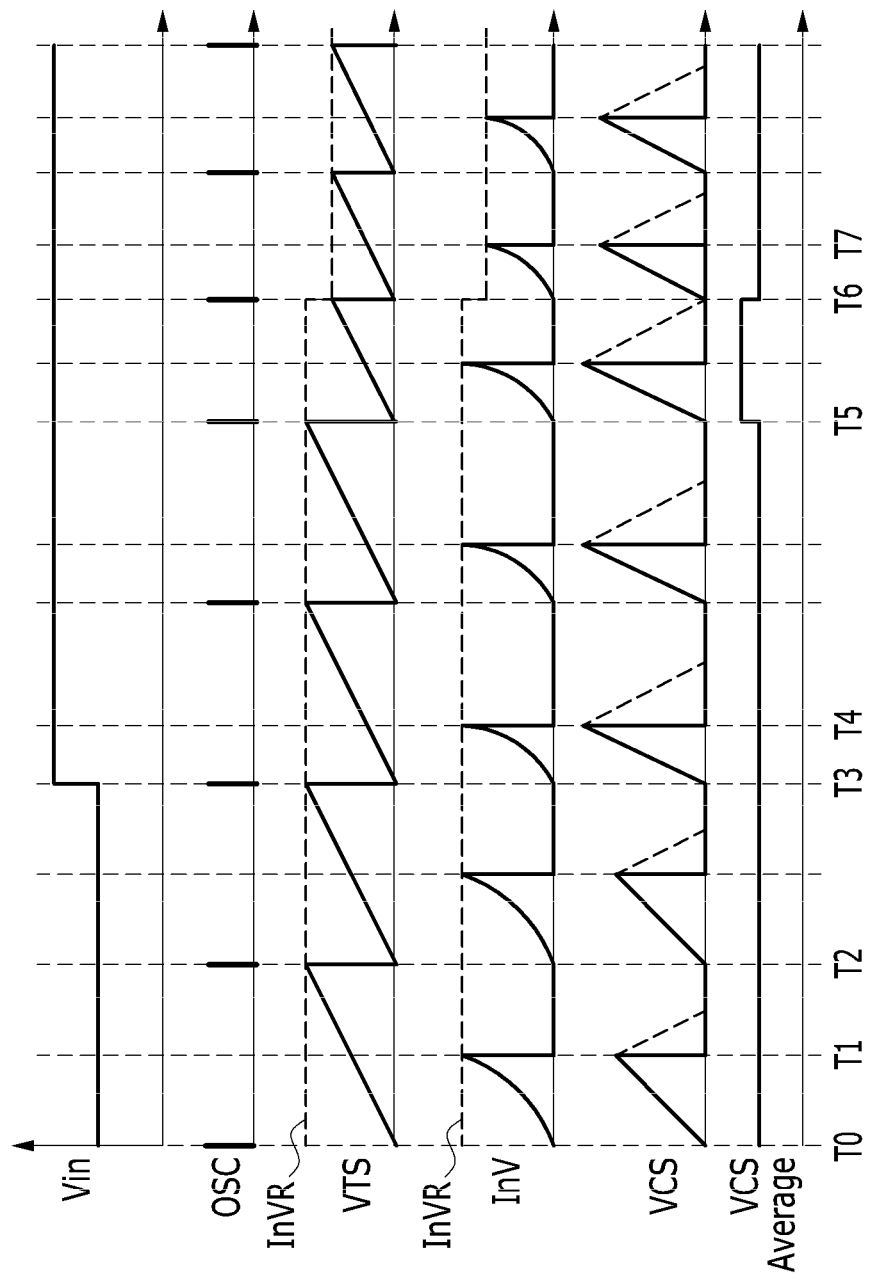
FIG. 3 is a waveform diagram of an input voltage, an oscillator signal, an input sense voltage, an input reference voltage, a switching cycle voltage, a sense voltage, and an average of the sense voltage.

FIG. 3 is a waveform diagram illustrating an input voltage, an oscillator signal, input sense voltage, an input reference voltage, a switching period voltage, a sense voltage, and an average of the sense voltage according to the exemplary embodiment.

As shown in FIG. 3, the input voltage Vin is increased at T3 and a switching period voltage is decreased after T5, but this is not restrictive.

At T0, a high-short pulse of the oscillator signal OSC is generated. Then, an SR latch 400 is synchronized by the oscillator signal OSC and thus generates a high-level gate voltage VG, and the power switch SW is turned on.

From T0, a current starts to flow to the power switch SW and a switch current Isw starts to increase. Thus, the sense voltage VCS also starts to increase from T0. When the input sense voltage InV reaches the input reference voltage InVR at T1, the power switch SW is turned off. During T0 to T1, the sense voltage VCS is increased with a slope that depends on the input voltage Vin, and the input sense voltage InV is also increased according to the increase of the sense voltage VCS. An increase waveform of the input sense voltage InV has a quadratic function form.

In detail, the input current calculator 100 integrates the sense voltage VCS and thus the input sense voltage InV corresponds to the area (a deviant crease lined portion) of the sense voltage VCS, and the input sense voltage InV is generated as given in Equation 1.

$$InV = \frac{1}{C1} \int_0^{TON} \frac{VCS}{R1} dt \qquad \text{[Equation 1]}$$

In Equation 1, C1 denotes capacitance of the capacitor C1, R1 denotes resistance of the resistor R1, and TON denotes a turn-on time of the power switch SW. For example, TON corresponds to a period T0 to T1 in FIG. 3. As shown in FIG. 3, the sense voltage VCS is a linear function with respect to time, and therefore the input sense voltage InV is a quadratic function which is an integration result of the linear function.

At T2, a high-level short pulse of the oscillator signal OSC is generated again. During one switching period T0 to T2 of the power switch SW, the multiplier 200 generates a voltage that charges the capacitor C2 using the reference current ICS according to the reference voltage VR. As shown in FIG. 3, the switching period voltage VTS is increased with a predetermined slope, and therefore the charging voltage becomes the highest at T2. Therefore, the input reference voltage InVR can be calculated as given in Equation 2.

$$InVR = \frac{1}{C2} \int_0^{Ts} \frac{VR}{R2} dt = \frac{VR \times Ts}{C2 \times R2} \quad \text{[Equation 2]}$$

In Equation 2, Ts denotes one switching period, C2 is capacitance of the capacitor C2, and R2 denotes resistance of the resistor R2. As shown in Equation 2, the input reference voltage InVR is proportional to the reference voltage VR and the switching period Ts.

Since the power switch SW is turned off when the input sense voltage InV reaches the input reference voltage InVR, the input sense voltage InV of Equation 1 and the input reference voltage InVR of Equation 2 are controlled to be equivalent to each other. That is, an equation like Equation 3 is established.

$$\frac{1}{C1} \int_0^{TON} \frac{VCS}{R1} dt = \frac{1}{C2} \int_0^{Ts} \frac{VR}{R2} dt = \frac{VR \times Ts}{C2 \times R2} \quad \text{[Equation 3]}$$

As previously stated, an average of one period of the switching current is an input current, and a result acquired by dividing an integration result of the VCS voltage that is proportional to the switching current during the turn-on period with the switching period Ts is as given in Equation 4.

$$\frac{1}{Ts} \int_0^{TON} VCS \, dt = \frac{C1 \times R1 \times VR}{C2 \times R2}$$

As shown in Equation 4, the input current Iin is controlled with a constant value. In this case, C1 and C2 are respectively the numerator and the denominator in Equation 4, and therefore variation of capacitance that may occur due to temperature variation and the like can be offset. In addition, R1 and R2 are respectively the numerator and the denominator in Equation 4, therefore variation of resistance that may occur due to temperature variation and the like can be offset. That is, variation of the input current Iin due to external factors such as temperature variation can be prevented.

When the input voltage Vin is increased at T3, an increase slope of the switching current Isw is increased. Thus, an increase slope of the sense voltage VCS is also increased. Then, the input sense voltage InV is quickly increased compared to before T3. The input sense voltage InV reaches the input reference voltage InVR at T4 and thus the power switch SW is turned off.

After T5, a frequency of the oscillator signal OSC is increased and thus the switching period is shortened. Then, the denominator in Equation 4 is decreased, and thus the average of the sense voltage VCS is increased.

When a high-level short pulse of the oscillator signal OCS is generated at T6, the switching period voltage VTS at T6 is sampled and held and thus the input reference voltage InVR is decreased (i.e., Ts in Equation 2 is decreased and therefore the input reference voltage InVR is decreased).

Then, the input sense voltage InV reaches the input reference voltage InVR at T7, and the duration of the turn-on time Ton is shortened compared to before T5. Since the integration period is decreased, the average of the sense voltage VCS is decreased after T6 and thus becomes equivalent to the average before T5.

As described, although the input voltage Vin is changed or the switching period Ts is changed, the average of the sense voltage VCS, that is, the input current Iin, is controlled to be constant.

Hereinafter, another exemplary embodiment of the present invention will be described with reference to FIG. 4 to FIG. 7.

Figure 4:
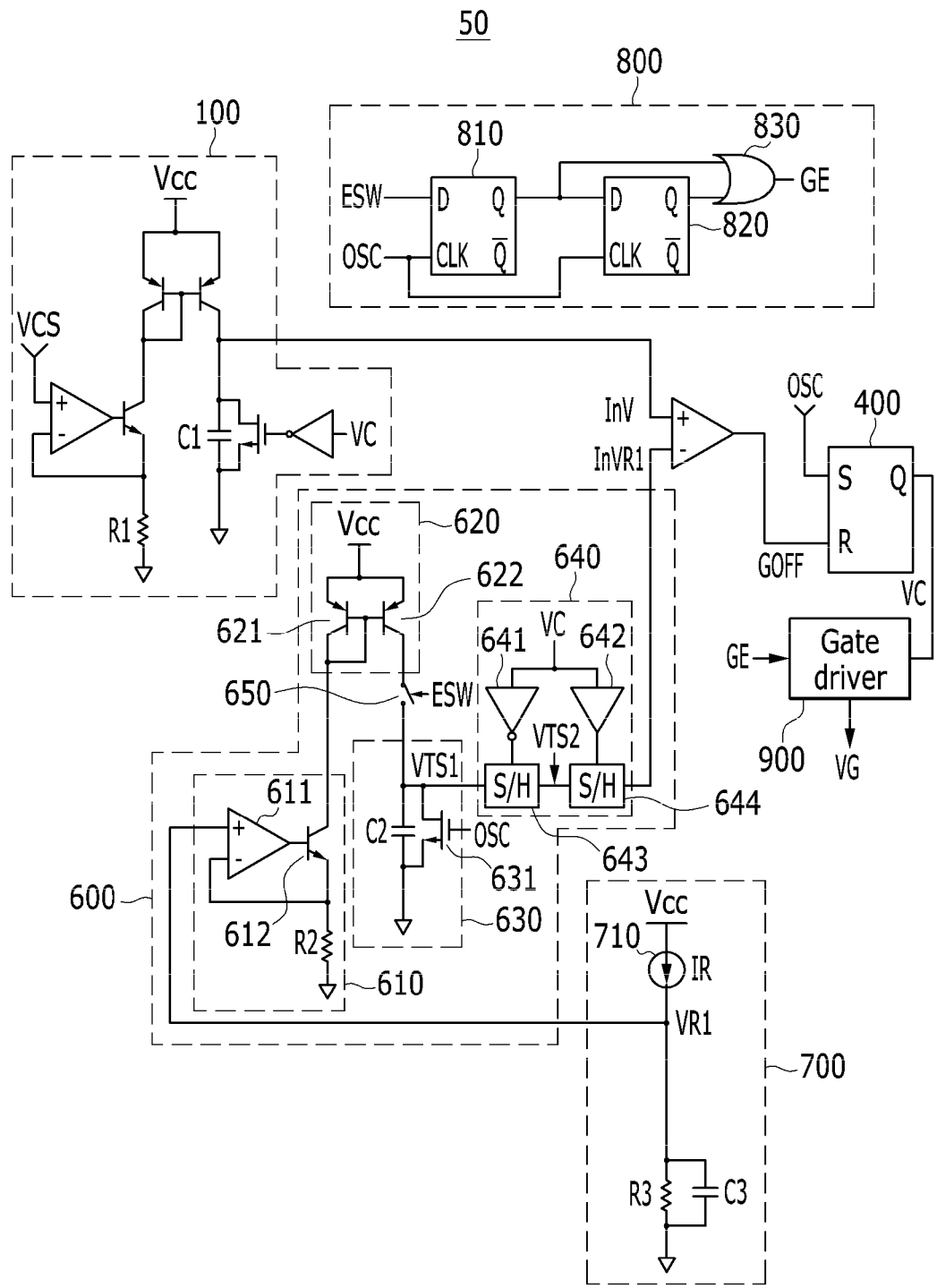
FIG. 4 shows a switch control circuit according to another exemplary embodiment.

FIG. 4 shows a switch control circuit according to another exemplary embodiment of the present invention.

As shown in FIG. 4, an input current calculator 100 is the same as the previous exemplary embodiment, and thus is designated with the same reference numeral.

A switch control circuit 50 according to the other exemplary embodiment further includes a gate enable unit 800 and an enable switch 650 that control an output section of a gate voltage VG. The switch control circuit 50 outputs the gate voltage VG only when an enable signal GE, which is an output of the gate enable unit 800, is a high level. The enable switch 650 performs a switching operating according to a switching enable signal ESW supplied from an external source. For example, the enable switch 650 is turned on by a high-level switching enable signal ESW and turned off by a low-level switching enable signal ESW.

A gate driver 900 generates a gate voltage VG according to a gate control signal VC during a high-level period of the gate enable signal GE, and generates a low-level gate voltage VG during a low-level period of the gate enable signal GE That is, the power switch SW performs a switching operation during the high-level period of the gate enable signal GE, and is in the turn-off state during the low-level period of the gate enable signal GE.

An AC input AC having passed through a dimmer (not shown) is rectified through a rectification circuit 10 such that an input voltage Vin may be generated. A specific period among one period of the input voltage Vin may be set to an operating period, and a part of the period, excluding the operating period among one period, may be set to an input voltage control period.

Figure 5:
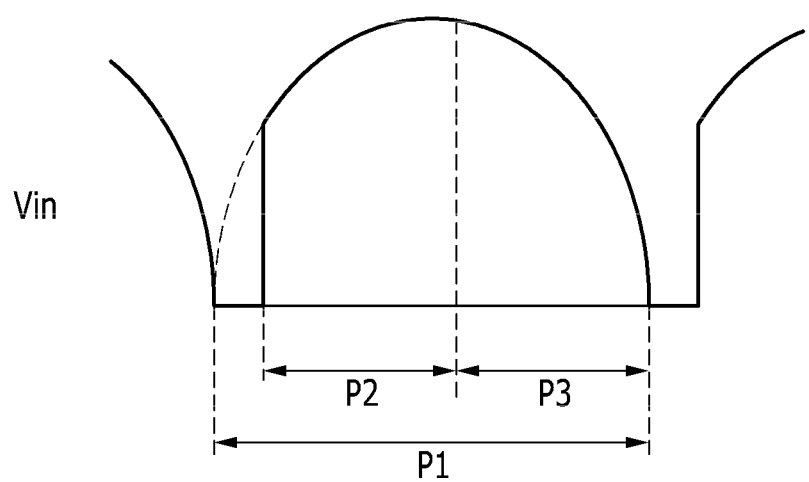
FIG. 5 is a waveform diagram of one cycle of the input voltage.

FIG. 5 is a waveform diagram illustrating one period of an input voltage.

As shown in FIG. 5, in one period P1 of the input voltage Vin, P2 denotes an operating period and P3 denotes an input voltage control period.

The switching operating is performed to supply power to a load of the power switch SW during the operating period P2, and the input voltage Vin is shaped to a specific waveform such as a sine wave during the input voltage control period P3. No input voltage Vin may be generated and the switching operating may not be performed during a period excluding the operating period P2 and the input voltage control period P3 among one period P1.

The switching enable signal ESW may be an enable level (e.g., a high level) during the operating period P2. The gate enable signal GE may be a signal that corresponds to the operating period P2 that is based on the switching enable signal ESW.

In this case, the operating period P2 may be controlled according to an output current Iout supplied to the load. In detail, the operating period P2 may be controlled according to a feedback voltage that corresponds to the output current Iout. As the feedback voltage is increased (as the output current is decreased in case of negative feedback), the operating period P2 is increased, and on the contrary, the operating period P2 is decreased as the feedback voltage is decreased (i.e., as the output current is increased).

However, the operation period P2 has a continuous value but the number of times of switching has a discrete value. For example, the number of times of switching may be 10.2 during the operating period P2. Thus, an inconsistency occurs during the operating period and the number of times of switching so that power supply cannot be precisely controlled.

In the present exemplary embodiment, an enable period of the switching enable signal ESW (or, operating period) and the number of times of switching are matched. This will be described later with reference to FIG. 6 and FIG. 7.

As shown in FIG. 4, the gate enable unit 800 includes two D-flip-flops 810 and 820 and one OR gate 830. The gate enable unit 800 forms a gate enable signal GE that is synchronized by a switching operation of the power switch SW according to the switching enable signal ESW and the oscillator signal OSC.

Each of the D-flip-flops 810 and 820 is synchronized with a rising edge of a signal input to a clock terminal CLK, and thus generates an output signal according to a signal input to an input terminal D and outputs an output signal through an output terminal Q. The output signal is maintained with a constant level from an input time of the rising edge to the clock terminal CLK to an input time of the next rising edge.

The switching enable signal ESW is input to the input terminal D of the D-flip-flop 810, the oscillator signal OSC is input to the clock terminal CLK of the D-flip-flop 810, and an output signal of the D-flip-flop 810 is output through the output terminal Q.

The output signal of the D-flip-flop 810 is input to the input terminal D of the D-flip-flop 820, the oscillator signal OSC is input to the clock terminal CLK of the D-flip-flop 820, and the output signal of the D-flip-flop 820 is output through the output terminal Q.

The OR gate 830 generates the gate enable signal GE by performing an OR operation on the output signal of the D-flip-flop 810 and the output signal of the D-flip-flop 820. When both of the inputs of the OR gate 830 are low level, the gate enable signal GE becomes low level.

The switching enable signal ESW is a signal supplied from the outside of the switch control circuit 50, and thus a rising time and a falling time of the switching enable signal ESW may not be synchronized with the oscillator signal OSC. Powering is compensated as much as a time difference between the switching enable signal ESW and oscillator signal OSC. An input reference voltage InVR1 is controlled according to the time difference between the switching enable signal ESW and the oscillator signal OSC such that powering is compensated. This will be described later with reference to FIG. 6 and FIG. 7.

A multiplier 600 according to the present exemplary embodiment includes a voltage-current converter 610, a current mirror circuit 620, a charging unit 630, and a sampling/holding unit 640. The voltage-current converter 610, the current mirror circuit 620, and the charging unit 630 are similar to the voltage-current converter 210, the current mirror circuit 220, and the charging unit 230 of the previous exemplary embodiment, and therefore no further description will be provided.

A reference voltage VR1 of the voltage-current converter 610 is supplied from a voltage generator 700. The voltage-current converter 610 includes an error amplifier 611 receiving the reference voltage VR1 from the voltage generator 700, a resistor R2, and a BJT 612.

The reference voltage VR1 is supplied to a non-inversion terminal (+) of the error amplifier 611, and an inversion terminal (−) of the error amplifier 611 is connected with a first end of the resistor R2 and an emitter of the BJT 612.

The voltage generator 700 includes a current source 710, a resistor R3, and a capacitor C3. The resistor R3 and the capacitor C3 are coupled in parallel, and a voltage generated when a current IR flows to the resistor R3 is the reference voltage VR1. The reference voltage VR1 can be changed by controlling a value of the resistor R3. When the resistor R3 is provided in an outer side of an IC where the switching control circuit 50 is realized, the reference voltage VR1 can be controlled by controlling the resistor R3 without modification of IC design. The capacitor C3 can remove noise by filtering the reference voltage VR1.

The current mirror circuit 620 includes two BJTs 621 and 622, a base and a collector of the BJT 621 are connected with each other, and the collector of the BJT 621 is connected to a collector of the BJT 622. A base of the 622 is connected to the base of the BJT 621, and emitters of the BJTs 621 and 622 are connected to a power voltage VCC.

An enable switch 650 is connected between the current mirror circuit 620 and the charging unit 630, and a capacitor C2 of the charging unit 630 is charged by a current supplied from a current mirror circuit 620 during a turn-on period of the enable switch 650 so that a switching period voltage VTS1 is generated. In detail, the enable switch 650 is connected between the emitter of the BJT 622 and a first electrode of the capacitor C2 of the charging unit 630.

A transistor 631 is connected in parallel with lateral ends of the charging unit 630, and the switching period voltage VTS1 is reset to a ground level when the transistor 631 is turned on by the oscillator signal OSC.

The sampling/holding unit 640 samples and holds a peak of the switching period voltage VTS1 for every switching period Ts to generate an input reference voltage InVR1.

In detail, the sampling/holding unit 640 includes an inverter 641 to which a gate control signal VC is input, a buffer 642, a first sampling/holding unit 643, and a second sampling/holding unit 644.

The inverter 641 inverts the gate control signal VC and outputs the inverted gate control signal VC, and the buffer 642 outputs the gate control signal VC.

The first sampling/holding unit 643 samples and holds the switching period voltage VTS1 when an output of the inverter 641 is the enable level (e.g., high level) and generates a switching operating voltage VTS2. The second sampling/holding unit 644 generates the input reference voltage InVR1 by sampling and holding the switching operating voltage VTS2 when the output of the buffer 642 is the enable level (e.g., high level). When the gate control signal VC is high level (i.e., a turn-on period of the power switch SW), the second sampling/holding unit 644 operates, and when the gate control signal VC is low level (i.e., a turn-off period of the power switch SW), the first sampling/holding unit 643 operates.

Hereinafter, input current control and a switching control method according to another exemplary embodiment of the present invention will be described with reference to FIG. 6 and FIG. 7.

Figure 6:
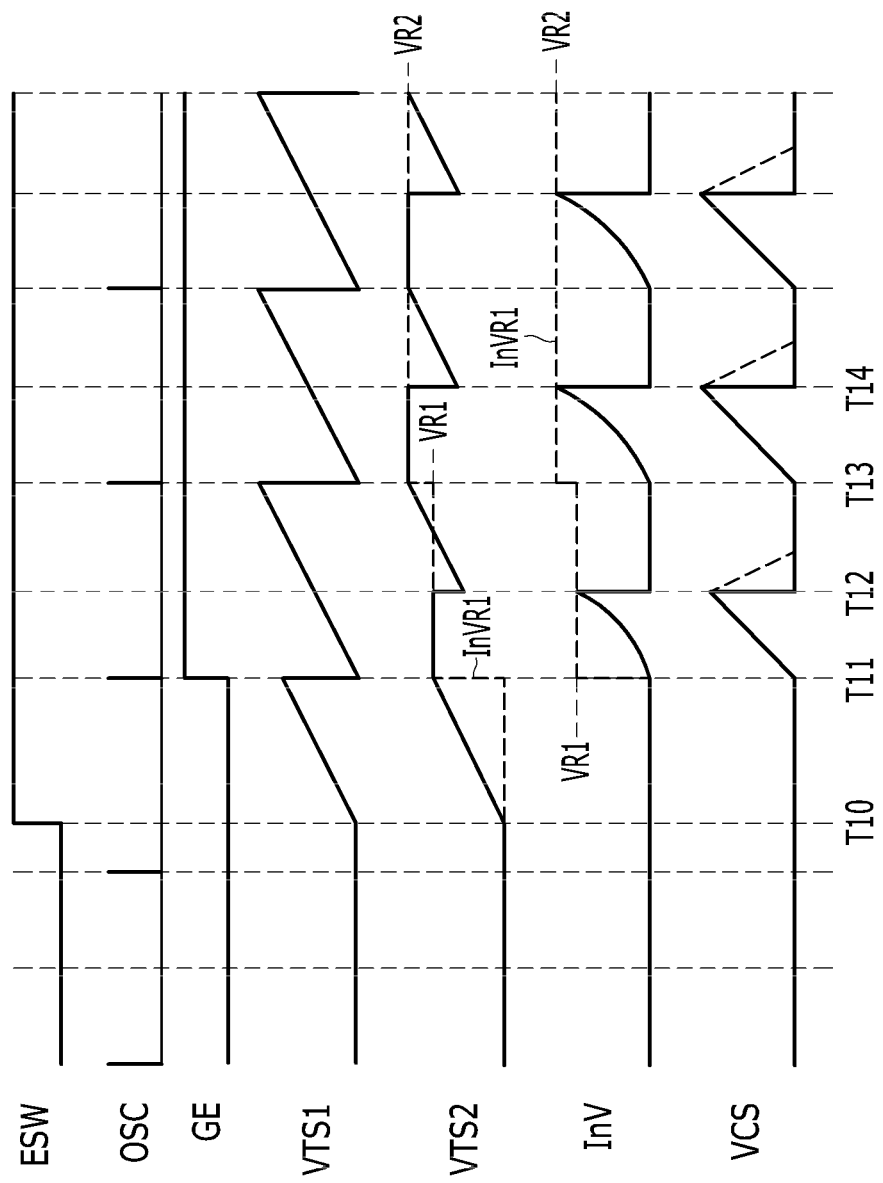
FIG. 6 is a waveform diagram of an oscillator signal, a gate enable signal, a switching cycle voltage, a switch operation voltage, an input reference voltage, an input sense voltage, and a sense voltage during a predetermined period including a time at which a switching enable signal is increased to a high level according to the other exemplary embodiment.

FIG. 6 is a waveform diagram illustrating an oscillator signal, a gate enable signal, a switching period voltage, a switching operating voltage, an input reference voltage, an input sense voltage, and a sense voltage during a predetermined period that includes a time when a switching enable signal is increased to the high level.

A switching enable signal ESW is increased at T10, and when an output of a D-flip-flop 810 becomes high level by being synchronized with a rising edge of the oscillator signal OCS at T11, a gate enable signal GE becomes high level. From the time T10 at which the switching enable signal ESW is increased to the time T11 at which the oscillator signal OSC is increased, that is, during a first correction period T10 to T11, the switching period voltage TS1 is increased and the first sampling/holding unit 643 receives the switching period voltage VTS1, samples and holds the switching period voltage VTS1 during a turn-off period of the power switch SW, and outputs a switch operating voltage VTS2. During the period T1 to T11, the power switch SW is in the turn-off state and therefore the switching operating voltage VTS2 is equivalent to the switching period voltage VTS1.

The second sampling/holding unit 644 generates the input reference voltage InVR1 by sampling and holding the second switching period voltage VTS2 during the turn-on period of the power switch SW.

At T11, the second sampling/holding unit 644 starts operating and generates the input reference voltage InVR1 by sampling and holding the switch operating voltage VTS2. Since the switching enable signal ESW is high-level at T11, the D-flip-flop 810 outputs a high-level output and the OR gate 830 generates a high-level gate enable signal GE.

The first sampling/holding unit 643 operates only during the turn-off period of the power switch SW, and therefore the switching period voltage VTS1 of the turn-off time in the previous switching period, that is, a peak of the switching period voltage, is held as the switch operating voltage VTS2. The switch operating voltage VTS2 is maintained with a constant level during the turn-on period of the power switch SW.

Since the second sampling/holding unit 644 generates the input reference voltage InVR1 by sampling and holding the switch operating voltage VTS2 during the turn-on period of the power switch SW, the input reference voltage is determined according to a peak of the switching period voltage VTS1 of the previous switching period.

At T11, the power switch SW is turned on and thus the switch current Isw flows, and the second voltage VCS starts to increase. Then, the input sense voltage InV also starts to increase with a quadratic function form. At 12, the increasing input sense voltage InV reaches the input reference voltage InVR1 and the power switch SW is turned off At T11, the switching period voltage VTS1 is reset to a ground voltage by the oscillator signal OCS and then starts to increase. From T12, the first sampling/holding unit 643 operates and generates the switch operating voltage VTS2 by sampling and holding the switching period voltage VTS1. Thus, the switch operating voltage VTS2 starts to increase from T12.

At T13, a high-level pulse of the oscillator signal OSC is generated and the power switch SW is turned on. The second sampling/holding unit 644 generates the input reference voltage InVR1 by sampling and holding the switch operating voltage VTS2. That is, the input reference voltage InVR1 is maintained with a peak of the switching period voltage VTS1 of the previous switching period T11 to T13 from T13. After T13, the level of the input reference voltage InVR1 is VR2.

From T13, the sense voltage VCS starts to increase and thus the input sense voltage InV is also increased. When the increasing input sense voltage InV reaches the level VR2 of the input reference voltage InVR1 at T14, the power switch is turned off.

Next, another exemplary embodiment of the present invention will be described with reference to FIG. 7.

Figure 7:
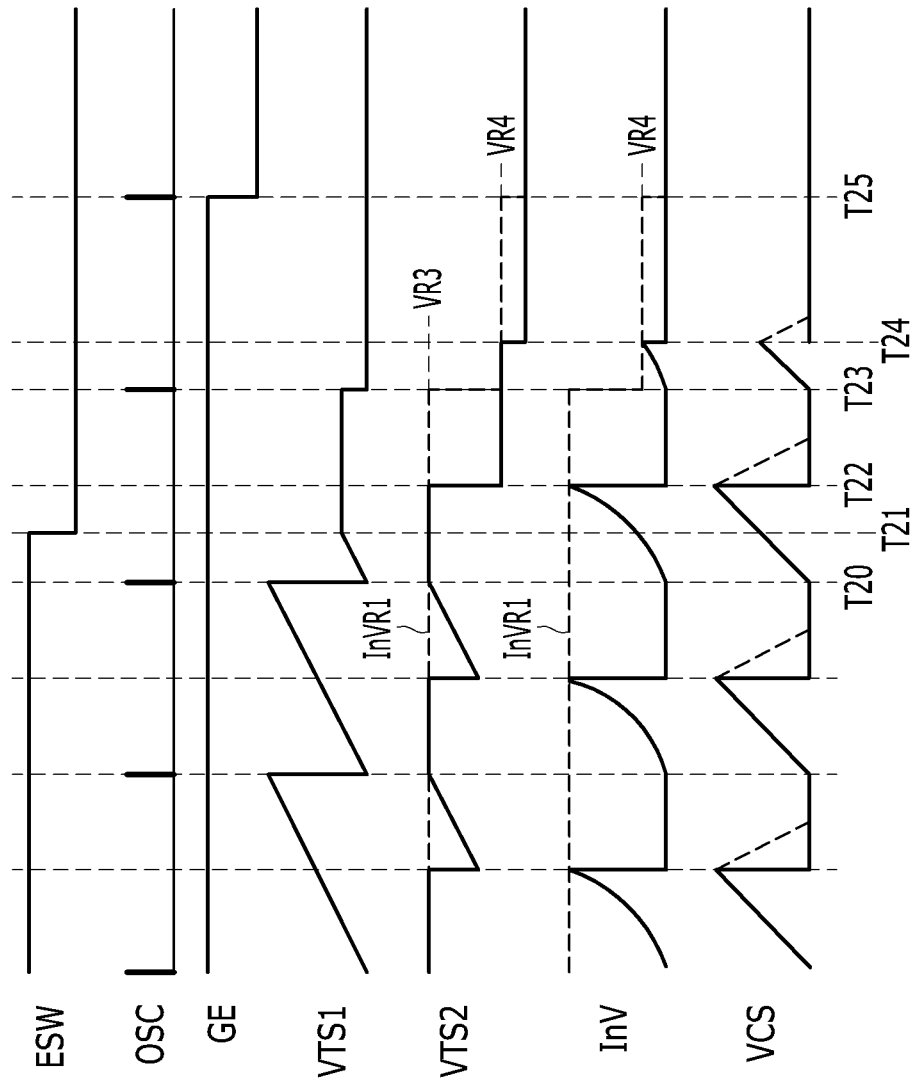
FIG. 7 is a waveform diagram of an oscillator signal, a gate enable signal, a switching cycle voltage, a switch operation voltage, an input reference voltage, an input sense voltage, and a sense voltage during a predetermined period including a time at which a switching enable signal is decreased to a low level according to the other exemplary embodiment.

FIG. 7 is a waveform diagram illustrating an oscillator signal, a gate enable signal, a switching period voltage, a switch operating voltage, an input reference voltage, an input sense voltage, and a sense voltage during a predetermined period including a time at which a switching enable signal is decreased to a low level.

At T20, a high-level pulse of the oscillator signal OSC is generated and thus a power switch SW is turned on, and a switching period voltage VTS1 is reset to a ground voltage and then starts to increase. From T20, a second sampling/holding unit 644 operates and generates an input reference voltage InVR1 by sampling and holding a switch operating voltage VTS2. Then, from T20, the input reference voltage InVR1 is constantly maintained with a peak level of a switching period voltage VTS1 of the previous period, that is, VT3, and a sense voltage VCS starts to increase and an input sense voltage InV also starts to increase.

At T21, a switching enable signal ESW is decreased to a low level. Then, an enable switch 650 is turned off and thus a current charging a capacitor C2 is blocked, and from T21, the switching period voltage VTS1 is maintained with a constant level by the capacitor C2.

When the input sense voltage InV reaches the level VR3 of the input reference voltage InVR at T22, the power switch SW is turned off. From T22, the first sampling/holding unit 643 operates and generates a switch operating voltage VTS2 by sampling and holding the switching period voltage VTS1. Then, the switch operating voltage VTS2 has a level of VR4 from T22.

At T23, a high-level pulse of the oscillator signal OSC is generated and the power switch SW is turned on. The second sampling/holding unit 644 generates the input reference voltage InVR1 by sampling and holding the switch operating voltage VTS2 of T23. That is, the input reference voltage InVR1 is maintained with a peak of the switching period voltage VTS1 of the previous switching period T20 to T23 from T23. After T23, the input reference voltage InVR1 has a level of VR4.

From T23, the sense voltage VCS starts to increase and the input sense voltage InV also increases. When the increasing input sense voltage InV reaches the level VR4 of the input reference voltage InVR1 at T24, the power switch SW is turned off.

From T21, the switching enable signal ESW is maintained with a low level and thus the enable switch 650 is in the turn-off state. Thus, the switching period voltage VTS1 is reset to a ground level by the high-level pulse of the oscillator signal OSC at T23, and then is maintained with the ground level rather than being increased.

From T24, the first sampling/holding unit 643 operates and generates a ground-level switch operating voltage VTS2. A gate control signal VC is increased to high level by the high-level pulse of the oscillator signal OSC of T25 and thus the second sampling/holding unit 644 starts operating. Then, the second sampling/holding unit 644 generates a ground-level input reference voltage InVR1 by sampling and holding the ground-level switch operating voltage VTS2.

Thus, the power switch SW is turned on at T25 and then turned off. Then, neither the sense voltage VCS nor the input sense voltage InV is generated.

Since the switching enable signal ESW is low level at T23, an output of the D-flip-flop 810 becomes low level by the high-level pulse of the oscillator signal OSC at T23. Since an input of the D-flip-flop 820 is low level at T25, an output of the D-flip-flop 820 becomes low level by the high-level pulse of the oscillator signal OSC at T25. That is, at T25, all inputs of the OR gate 830 become low level and therefore the gate enable signal GE becomes low level.

As described, in the present exemplary embodiment, the first switching operation after the start time of the operating period and the last switching operation after the termination time of the operating period are controlled to sequentially control the switching operation according to the operating period. In detail, a turn-on period in the first switching operation and a turn-on period in the last switching operation are controlled.

For example, a turn-on period in the first switching operating period after the start time of the operating period, i.e., T11 to T13, is determined according to the input reference voltage InVR1 that is determined according to the period T10 to T11. That is, in the first switching operating after the start time of the operating period, a peak of the switching period voltage VTS1 that is proportional to the period T10 to T11 becomes the input reference voltage InVR1, and when the input sense voltage InVR reaches the input reference voltage InVR1, the power switch SW is turned off.

In addition, a turn-on period of the last switching operating period after the termination time of the operating period, i.e., T23 to T25, is determined according to the input reference voltage InVR1 that is determined according to the period T20 to T21. That is, in the last switching operating after the start time of the operating period, a peak of the switching period voltage VTS1 that is proportional to the period T20 to T21 becomes the input reference voltage InVR21, and when the input sense voltage InV reaches the input reference voltage INVR1, the power switch SW is turned off.

As described, powering can be compensated as much as a time difference between an increase time of the oscillator signal OSC and the switching enable signal by controlling the input reference voltage InVR1.

According to another exemplary embodiment of the present invention, an average of a current flowing to a switch that controls power supply can be controlled to follow a sine wave. An average of a switch current is an input current. According to another exemplary embodiment of the present invention, an average of a sense voltage that indicates a switch current can be controlled to follow a sine wave. Without regard to a continuous conduction mode (CCM) and a discrete conduction mode (DCM), the input current is controlled with a sine wave such that power factor correction can be implemented.

Figure 8:
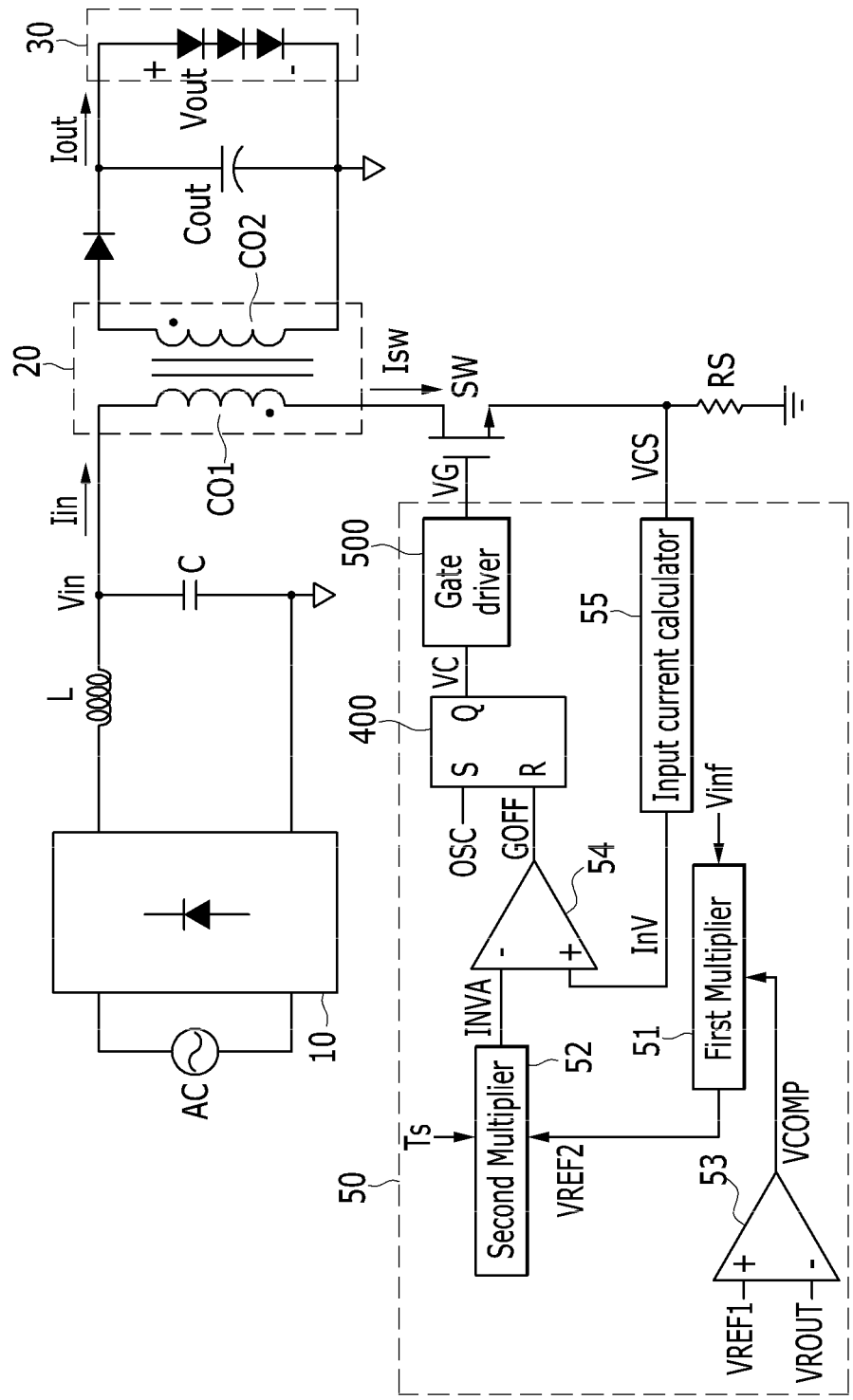
FIG. 8 shows a power supply according to another exemplary embodiment of the present invention.

FIG. 8 shows a power supply according to another exemplary embodiment of the present invention.

The same reference numerals designate the same elements in the exemplary embodiment of FIG. 1, and the description of the duplicated configuration of the exemplary embodiment of FIG. 1 is omitted.

A switch control circuit 50 of the exemplary embodiment shown in FIG. 8 further includes a first multiplier 51 and a second multiplier 52.

An error amplifier 53 generates a comparison voltage VCOM by amplifying a difference between a voltage that corresponds to an output current (e.g., VIOUT) and a first reference voltage (e.g., VREF1). In detail, the voltage IVOUT is supplied to an inversion terminal (−) and the first reference voltage VREF1 is supplied to a non-inversion terminal (+). The error amplifier 53 generates the comparison voltage VCOMP by amplifying a value acquired by subtracting an input of the inversion terminal (−) from an input of the non-inversion terminal (+) with a predetermined gain.

The first multiplier 51 generates a second reference voltage VREF2 by multiplying input voltage information Vinf to the comparison voltage VCOMP.

The second reference voltage VREF may be a sine wave scaled from the input voltage information Vint according to the first reference voltage VREF1. As information on the input voltage Vin, the input voltage information Vinf may be generated using various methods.

The second multiplier 52 generates an input reference voltage INVA by multiplying a switching period Ts to the second reference voltage VREF2.

An input current calculator 55 may be implemented according to any one of the previously described exemplary embodiments. That is, the input current calculator 55 generates an input sense voltage InV by integrating a sense voltage VCS.

An input current comparator 54 compares the input sense voltage InV with the input reference voltage INVA, and generates a gate-off signal GOFF according to a result of the comparison. For example, the input current comparator 54 includes a non-inversion terminal (+) to which the input sense voltage InV is input and an inversion terminal (−) to which the input reference voltage INVA is input. When an input of the non-inversion terminal (+) is higher than an input of the inversion terminal (−), the input current comparator 54 generates a high-level gate-off signal GOFF, when an input of the non-inversion terminal (+) is lower than the input of the inversion terminal (−), the input current comparator 54 generates a low-level gate-off signal GOFF.

The input sense voltage InV and the input reference voltage INVA can be equally controlled as given in Equation 5.

$$K*VREF2*Ts=InV$$

$$K*VREF2=InV/Ts \qquad \text{[Equation 5]}$$

A value acquired by dividing an integration result of the sense voltage VCS with the switching period Ts, i.e., an average InV/Ts of the switch current equals VREF2*K. Since VREF2 is a sine wave that depends on the input voltage information Vinf and K is a predetermined conversion coefficient, the average of the switch current follows a sine wave. Accordingly, the input current Iin is a sine wave.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS power supply 1, rectification circuit 10
inductor L, capacitor C
transformer 20, rectification diode D
output capacitor COUT, power switch SW
sense resistor RS, switch control circuit 40
input current calculator 100, 55
multiplier 200, input current comparator 300, 54
SR latch 400, gate driver 500
voltage-current converter 110, 210, and 610
current mirror circuit 120, 220, and 620
charger 130, 230, and 630
sampling/holding unit 240
error amplifier 111, 211, 611, and 53
resistor R1, R2, and R3

BJT (112, 121, 122, 221, 222, 612, 621, 622)
capacitor C1, C2, and C3, transistor 131, 231, and 631
inverter 132 and 641, sampling/holding unit 640
buffer 642, first sampling/holding unit 643
second sampling/holding unit 644, enable switch 650
voltage generator 700, current source 710
gate enable unit 800
D-flip-flop 810 and 820
OR gate 830
first multiplier 51
second multiplier 52

What is claimed is:

1. An input current control method of a power supply including a power switch, comprising:
    generating an input sense voltage by integrating a sense voltage that indicates a switch current flowing to the power switch for a switching period of the power switch;
    comparing the input sense voltage with a predetermined input reference voltage, wherein the input reference voltage is based on the switching period and a predetermined reference voltage; and
    controlling a switching operation of the power switch according to a result of the comparison.

2. The input current control method of claim 1, wherein generating the input sense voltage comprises:
    converting the sense voltage to a sense current; and
    charging a first capacitor using the sense current, wherein the input sense voltage is a voltage charged in the first capacitor.

3. The input current control method of claim 2, wherein the charging the first capacitor with the sense current is performed until the input sense voltage reaches the input reference voltage.

4. The input current control method of claim 1, wherein controlling the switching operation comprises turning off the power switch at a time that the input sense voltage reaches the input reference voltage.

5. The input current control method of claim 1, wherein generating the input reference voltage further comprises:
    converting the reference voltage to a reference current;
    charging a second capacitor for the switching period using the reference current; and
    generating the input reference voltage by sampling and holding a peak of a switching period voltage charged in the second capacitor for each switching period.

6. The input current control method of claim 5, wherein the voltage charged in the second capacitor is reset by being synchronized at a turn-on time of the power switch.

7. The input current control method of claim 5, wherein the charging of the second capacitor is performed for a predetermined period while a switching enable signal is an enable level.

8. The input current control method of claim 7, further comprising:
    generating a first output according to a level of a switching enable signal that controls the switching enable period by being synchronized with an oscillator signal that determines a switching frequency of the power switch;
    generating a second output according to a level of the first output by being synchronized with the oscillator signal; and
    performing an OR operation on the first output and the second output, and generating a gate voltage for driving the power switch according to a result of the OR operation.

9. The input current control method of claim 1, further comprising generating the reference voltage using an information corresponding to an input voltage of the power supply and a comparison voltage generated by amplifying a difference between a voltage that corresponds to an output current of the power supply and a first reference voltage.

10. The input current control method of claim 9, wherein generating the input reference voltage comprises generating the input reference voltage by multiplying the reference voltage and the switching period.

11. The input current control method of claim 9, wherein generating the reference voltage comprises multiplying the comparison voltage and the information corresponding to an input voltage.

12. A switch control circuit to control a switching operation of a power switch, comprising:
    an input current calculator configured to generate an input sense voltage by integrating a sense voltage that indicates a switching current flowing to the power switch for each switching period of the power switch;
    an input current comparator configured to generate a gate-off signal according to a result of comparison between the input sense voltage and a predetermined input reference voltage, wherein the power switch is turned off according to the gate-off signal; and
    a multiplier configured to generate an input reference voltage using a predetermined reference voltage and the switching period.

13. The switch control circuit of claim 12, wherein the input current calculator comprises:
    a first voltage-current converter configured to receive the sense voltage and generate a sense current that depends on the sense voltage; and
    a first charging unit configured to generate the input sense voltage by charging a first capacitor for a turn-on period of the power switch with a current that corresponds to the sense current.

14. The switch control circuit of claim 13, wherein the first voltage-current converter comprises:
    a first error amplifier configured to generate an output that controls a voltage of a first input end to which the sense voltage is input and a voltage of a second input terminal to be equivalent to each other;
    a first BJT including a base to which an output of the first error amplifier is input; and
    a first resistor including a first terminal connected to an emitter of the first BJT and the second input terminal, wherein the sense current flows to a ground through the first BJT and the first resistor.

15. The switch control circuit of claim 14, wherein the input current calculator further comprises a first current mirror circuit connected to a collector of the first BJT and is configured to supply a current to the first capacitor by mirroring the sense current.

16. The switch control circuit of claim 13, wherein the first charging unit comprises a first transistor connected in parallel with the first capacitor, wherein the first transistor is turned off during a turn-on period of the power switch.

17. The switch control circuit of claim 12, wherein the multiplier comprises:
    a second voltage-current converter configured to receive the reference voltage and generate a reference current that depends on the reference voltage;
    a second charging unit configured to generate a switching period voltage by charging a second capacitor with a current that corresponds to the reference current for the switching period; and a sampling/holding unit configured to generate the input reference voltage by sampling and holding a peak of the switching period voltage for each switching period.

18. The switch control circuit of claim 17, wherein the second voltage-current converter comprises:
a second error amplifier configured to generate an output that controls a voltage of a first input end to which the reference voltage is input and a voltage of a second input terminal to be equivalent to each other;
a second BJT including a base to which an output of the second error amplifier is input; and
a second resistor including a first terminal connected to an emitter of the second BJT and the second input terminal, wherein the reference current flows to the ground through the second BJT and the second resistor.

19. The switch control circuit of claim 18, wherein the multiplier further comprises a second current mirror circuit connected to a collector of the second BJT and configured to supply a current to the second capacitor by mirroring the reference current.

20. The switch control circuit of claim 17, wherein the second charging unit comprises a second transistor connected in parallel with the second capacitor, wherein the second transistor is turned on by being synchronized at a turn-on time of the power switch.

21. The switch control circuit of claim 17, wherein the multiplier further comprises an enable switch to control a current supplied to the second capacitor, wherein the enable switch is to perform a switching operation according to a switching enable signal and the switching enable signal controls a switching operation period of the power switch.

22. The switch control circuit of claim 21, further comprising a gate enable unit configured to determine whether or not to output a gate voltage that switches the power switch based on the switching enable signal and an oscillator signal that determines the switching frequency.

23. The switch control circuit of claim 22, wherein the gate enable unit comprises:
a first D-flip-flop unit having a clock terminal to which the oscillator signal that determines the switching frequency of the power switch is input and an input terminal to which the switching enable signal is input, and is to output a first output according to the switching enable signal by being synchronized with the oscillator signal;
a second D-flip-flop having a clock terminal to which the oscillator signal is input and an input terminal to which the first output is input, and is to generate a second output according to a level of the first output by being synchronized with the oscillator signal; and
an OR gate that performs an OR operation on the first output and the second output.

24. The switch control circuit of claim 12, wherein the input current calculator comprises a first resistor to which the sense voltage is applied and a first capacitor to be charged with a current that corresponds to a sense current flowing to the first resistor, wherein the multiplier comprises a second resistor to which the reference voltage is input and a second capacitor charged with a current that corresponds to a reference current flowing to the second resistor, and further wherein
the input current is proportional to a result acquired by dividing a value of multiplication of resistance of the first resistor and capacitance of the first capacitor with a value of multiplication of resistance of the second resistor and capacitance of the second capacitor.

25. The switch control circuit of claim 12, further comprising:
a first multiplier configured to generate the reference voltage using information on an input voltage of the power supply and a comparison voltage generated by amplifying a difference between a voltage corresponding to an output current controlled according to the switching operation of the power switch and a first reference voltage; and
a second multiplier configured to generate the input reference voltage by multiplying a reference voltage and a switching period of the power switch.

26. A power supply, comprising:
a power switch electrically connected with an input voltage; and
a switch control circuit to generate an input sense voltage by integrating a sense voltage corresponding to a switching current flowing to the power switch for each switching period of the power switch, and controlling a switching operation of the power switch according to a result of comparison between the input sense voltage and a predetermined input reference voltage, wherein the switch control circuit comprises:
a first multiplier to generate the reference voltage using information on the input voltage of the power supply and a comparison voltage generated by amplifying a difference between a voltage corresponding to an output current of the power supply and a first reference voltage; and
a second multiplier to generate the input reference voltage by multiplying the reference voltage and the switching period of the power switch.

27. The power supply of claim 26, wherein the switch control circuit is to generate a switching period voltage by charging a capacitor using a predetermined reference voltage for each switching period, and is to generate the input reference voltage by sampling and holding the switching period voltage for each switching period.

28. The power supply of claim 26, wherein the switch control circuit is to determine whether or not to output a gate voltage that switches the power switch based on a switching enable signal that controls a predetermined switching enable period and an oscillator signal that determines a switching frequency of the power switch.

29. The power supply of claim 28, wherein the switching enable period is a predetermined period in a period during which the input voltage is generated.

* * * * *